(12) United States Patent
Okubo (10) Patent No.: US 10,115,612 B2
(45) Date of Patent: Oct. 30, 2018

(54) MANUFACTURING METHOD FOR VERTICAL CAVITY SURFACE EMITTING LASER

(71) Applicant: MURATA MANUFACTURING CO., LTD., Kyoto-fu (JP)

(72) Inventor: Satoshi Okubo, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 60 days.

(21) Appl. No.: 15/069,029

(22) Filed: Mar. 14, 2016

(65) Prior Publication Data

US 2016/0197455 A1   Jul. 7, 2016

Related U.S. Application Data

(63) Continuation of application No. PCT/JP2014/066114, filed on Jun. 18, 2014.

(30) Foreign Application Priority Data

Sep. 17, 2013 (JP) .................................. 2013-191860

(51) Int. Cl.
  *H01L 21/67* (2006.01)
  *H01S 5/183* (2006.01)
  (Continued)

(52) U.S. Cl.
  CPC .. *H01L 21/67115* (2013.01); *H01L 21/67098* (2013.01); *H01S 5/0425* (2013.01);
  (Continued)

(58) Field of Classification Search
  CPC ......... H01L 21/67098; H01L 21/67115; H01S 5/18313
  See application file for complete search history.

(56) References Cited

U.S. PATENT DOCUMENTS 8,173,452 B1   5/2012 Petti et al.
9,048,270 B2 *  6/2015 Wander ............. H01L 21/67109
(Continued)

FOREIGN PATENT DOCUMENTS

JP   08-070007 A   3/1996
JP   2003-324048 A   11/2003
(Continued)

OTHER PUBLICATIONS

International Search Report issued in PCT/JP2014/066114; dated Sep. 22, 2014.
(Continued)

*Primary Examiner* — Marcia Golub-Miller
(74) *Attorney, Agent, or Firm* — Studebaker & Brackett PC (57) ABSTRACT

A manufacturing method for a vertical cavity surface emitting laser includes steps of forming, on a substrate, a multilayer body including first and second Distributed Bragg Reflector layers, an active layer, and a to-be-oxidized layer becoming a current constriction structure, processing the multilayer body such that a lateral surface of at least the to-be-oxidized layer is exposed, and forming a current constriction structure by oxidizing the to-be-oxidized layer from the lateral surface thereof after the multilayer body has been processed. The step of forming the current constriction structure includes steps of holding the substrate to be positioned along a uniformly-heated plate that is placed on a heat conduction member, and to be spaced from the uniformly-heated plate, and heating the substrate by radiant heat from the uniformly-heated plate by heating the heat conduction member.

4 Claims, 9 Drawing Sheets

(51) Int. Cl.
  *H01S 5/042* (2006.01)
  *H01S 5/30* (2006.01)
  *H01S 5/343* (2006.01)
  *H01S 5/187* (2006.01)
  *H01S 5/32* (2006.01)

(52) U.S. Cl.
  CPC .......... *H01S 5/187* (2013.01); *H01S 5/18313* (2013.01); *H01S 5/3054* (2013.01); *H01S 5/3432* (2013.01); *H01S 5/3211* (2013.01); H01S 2301/176 (2013.01)

(56) References Cited

U.S. PATENT DOCUMENTS

| | | | |
|---|---|---|---|
| 9,514,951 B2* | 12/2016 | Kaneda | H01L 21/02118 |
| 2008/0233017 A1* | 9/2008 | Sato | H01S 5/18358 |
| | | | 422/129 |
| 2010/0311194 A1 | 12/2010 | Sasaki et al. | |
| 2012/0167969 A1 | 7/2012 | Petti | |
| 2012/0168091 A1 | 7/2012 | Kell et al. | |
| 2012/0171809 A1 | 7/2012 | Kell et al. | |
| 2012/0220068 A1 | 8/2012 | Petti et al. | |
| 2013/0252424 A1* | 9/2013 | Lin | H01L 21/68735 |
| | | | 438/689 |
| 2014/0231012 A1* | 8/2014 | Hinode | C09K 13/04 |
| | | | 156/345.23 |
| 2016/0133504 A1* | 5/2016 | Chu | H01L 21/67115 |
| | | | 165/146 |

FOREIGN PATENT DOCUMENTS

| | | |
|---|---|---|
| JP | 2007-242850 A | 9/2007 |
| JP | 2010-129894 A | 6/2010 |
| JP | 2011-018876 A | 1/2011 |
| WO | 2012/092026 A2 | 7/2012 |

OTHER PUBLICATIONS

Written Opinion issued in PCT/JP2014/066114; dated Sep. 22, 2014.

* cited by examiner

MANUFACTURING METHOD FOR VERTICAL CAVITY SURFACE EMITTING LASER

CROSS REFERENCE TO RELATED APPLICATIONS

This application claims benefit of priority to Japanese Patent Application 2013-191860 filed Sep. 17, 2013, and to International Patent Application No. PCT/JP2014/066114 filed Jun. 18, 2014, the entire content of which is incorporated herein by reference.

TECHNICAL FIELD

The present disclosure relates to a manufacturing method for a vertical cavity surface emitting laser.

BACKGROUND

A vertical cavity surface emitting laser (VCSEL) is a laser device in which an optical resonator is formed in a direction vertical to a substrate surface and a laser beam is output in the direction vertical to the substrate surface. Usually, a current constriction structure is formed in the VCSEL to concentrate a current to a light emitting region.

In many cases, a cavity structure formed by oxidizing the outer peripheral side of an AlAs (aluminum arsenic) layer is utilized as the current constriction structure. More specifically, the AlAs layer is oxidized by holding, in water vapor heated to 400 to 500° C., a substrate on which a multilayer body (oxidation object) processed into a mesa-like shape such that the AlAs layer is exposed at a lateral surface of the multilayer body. In that case, a temperature distribution inside the substrate is desirably within ±1° C.

A method disclosed in Japanese Unexamined Patent Application Publication No. 2011-18876 is known as a process for making the temperature distribution inside the substrate more uniform. According to the method disclosed in Japanese Unexamined Patent Application Publication No. 2011-18876, an upper surface of a radiation plate on which the substrate is placed is processed into a spherical shape corresponding to a warp of the substrate on which the oxidation object is formed, the warp being caused during thermal oxidation.

SUMMARY

Technical Problem

The method disclosed in Japanese Unexamined Patent Application Publication No. 2011-18876 has the following problem. Because a warp amount of the substrate is different depending on the substrate temperature, it is difficult to accurately grasp the warp amount during the thermal oxidation. Because the warp amount of the substrate is further different depending on the structure and the growth conditions of an epitaxial film that is formed on the substrate, the warp amount takes a different value per product type (model number). Therefore, the radiation plate having an upper surface with a different curvature needs to be prepared per product type in order to implement the method disclosed in Japanese Unexamined Patent Application Publication No. 2011-18876. Thus, the disclosed method is not easy to put it into practice.

Inherently, the warp amount of the substrate is about 20 μm. Accordingly, when the substrate is heated by radiant heat in a state where a space of about several hundred microns is held between the radiation plate and the substrate, the warp amount of the substrate is substantially a negligible value, and there is no need of processing the upper surface of the radiation plate into a spherical surface.

The inventors of the present disclosure have found that the problem with the case of heating the substrate by radiant heat from the radiation plate with the space held between the radiation plate and the substrate is a temperature distribution of the radiation plate because a temperature distribution of the substrate directly reflects the temperature distribution of the radiation plate. In other words, the radiation plate is usually heated by electrically-heated wires that are disposed inside a heater device, and an appreciable temperature distribution is generated in the radiation plate depending on the layout of the electrically-heated wires. However, the temperature distribution of the radiation plate is not at all taken into consideration in Japanese Unexamined Patent Application Publication No. 2011-18876.

The present disclosure has been made in consideration of the above-described problem, and an object of the present disclosure is to make a temperature distribution inside a substrate more uniform than in prior art when a current constriction layer is formed by a thermal oxidation method in manufacturing a vertical cavity surface emitting laser.

Solution to Problem

According to one aspect of the present disclosure, there is provided a manufacturing method for a vertical cavity surface emitting laser, the method including steps of forming, on a substrate, a multilayer body including first and second Distributed Bragg Reflector layers, an active layer, and a to-be-oxidized layer becoming a current constriction structure, processing the multilayer body into a mesa shape such that a lateral surface of at least the to-be-oxidized layer is exposed, and forming the current constriction structure by oxidizing the to-be-oxidized layer from the lateral surface thereof after the multilayer body has been processed into the mesa shape. The step of forming the current constriction structure includes steps of holding the substrate to be positioned along a uniformly-heated plate that is placed on a heat conduction member, and to be spaced from the uniformly-heated plate, and heating the substrate by radiant heat from the uniformly-heated plate by heating the heat conduction member.

With the manufacturing method described above, a temperature distribution of the heat conduction member is made more uniform by the uniformly-heated plate, the oxidation can be performed in a state where temperature of the substrate in a planar direction has higher uniformity.

Preferably, the uniformly-heated plate is made of an anisotropic material having a larger thermal conductivity in a planar direction than in a vertical direction. By employing the uniformly-heated plate made of the above-mentioned anisotropic material, a non-uniform temperature distribution within the uniformly-heated plate can be effectively suppressed even when a non-uniform temperature distribution occurs within the heat conduction member.

Preferably, a material of the uniformly-heated plate is Pyrolytic Graphite. The Pyrolytic Graphite has the above-mentioned anisotropy in thermal conductivity.

Preferably, the step of holding the substrate includes a step of supporting a peripheral edge portion of the substrate by a spacer that is attached to the heat conduction member. In this case, preferably, a thermal conductivity of the spacer is smaller than the thermal conductivity of the uniformly-heated plate in the vertical direction. With that feature, the substrate can be suppressed from being heated through thermal conduction via the spacer.

Preferably, the heat conduction member and the uniformly-heated plate are disposed within an oxidation furnace. The step of heating the substrate is executed in a state that pressure in the oxidation furnace is reduced. By heating the substrate under the reduced pressure, the substrate can be suppressed from being heated through thermal conduction via gas, and the substrate is mainly heated by radiant heat from the uniformly-heated plate. As a result, uniformity of the substrate temperature can be further increased.

Advantageous Effects of Disclosure

According to the present disclosure, when the current constriction layer is formed by a thermal oxidation method in manufacturing the vertical cavity surface emitting laser, a temperature distribution inside the substrate can be made more uniform than in prior art.

DETAILED DESCRIPTION

An embodiment will be described in detail below with reference to the drawings. In the following, a configuration of a VCSEL and a method of manufacturing the VCSEL are first described, and a method of heating a substrate, i.e., a feature of the present disclosure, is then described in detail. It is to be noted that the same or corresponding components are denoted by the same reference signs, and that description of those components is not repeated in some cases.

Configuration of VCSEL

Figure 1:
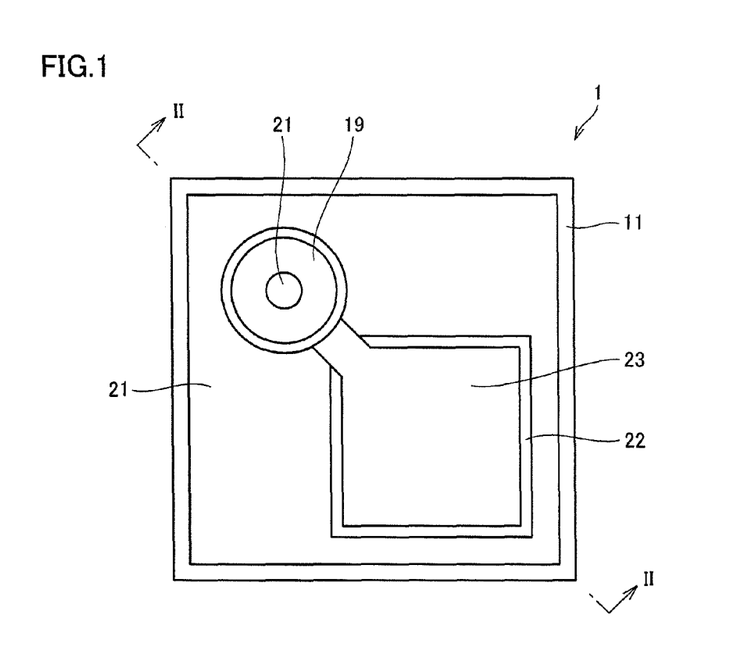
FIG. 1 is a plan view schematically illustrating a configuration of a VCSEL.
Figure 2:
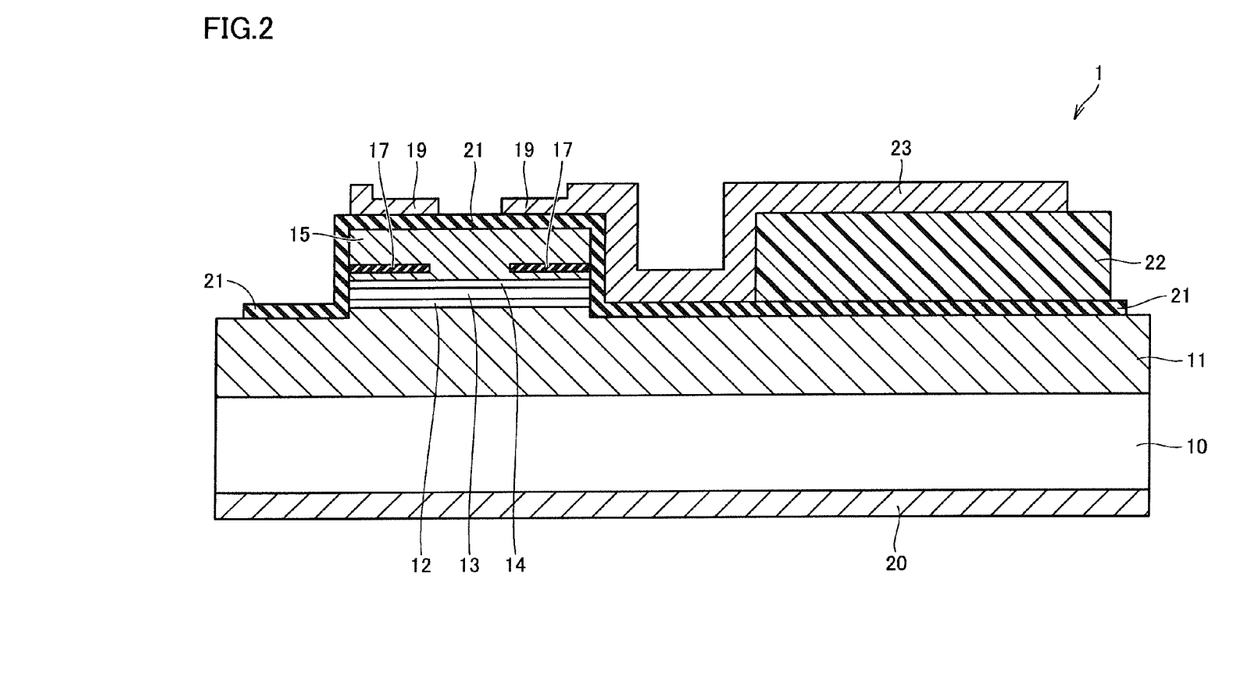
FIG. 2 schematically illustrates a sectional structure taken along a line II-II in FIG. 1.
Figure 3:
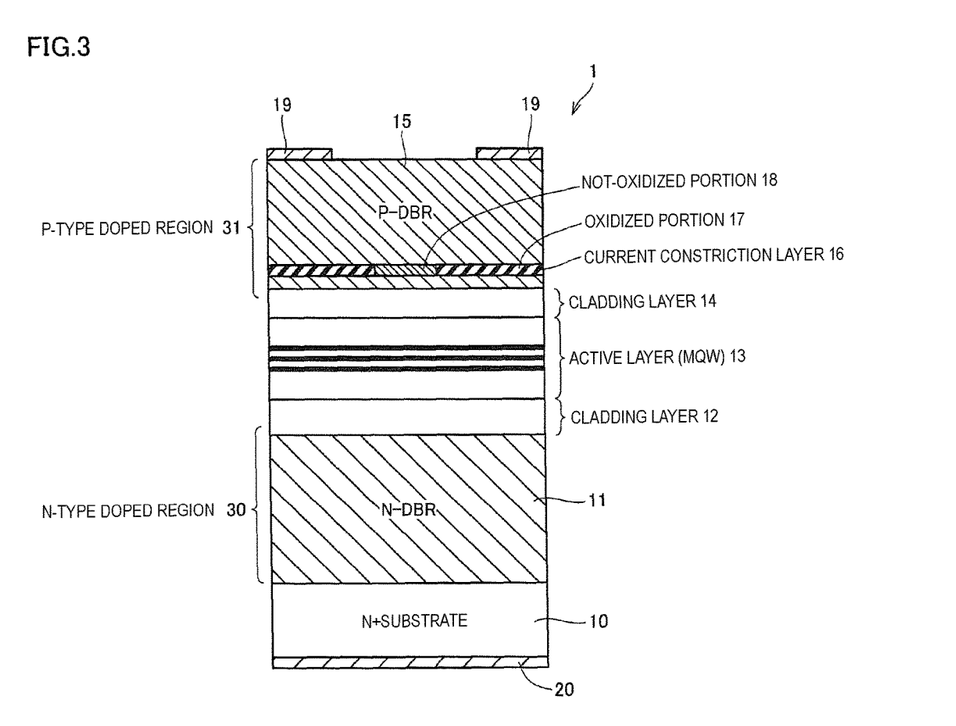
FIG. 3 is an enlarged view of a part of FIG. 2.

FIG. 1 is a plan view schematically illustrating a configuration of a VCSEL. FIG. 2 schematically illustrates a sectional structure taken along a line II-II in FIG. 1. FIG. 3 is an enlarged view of a part of FIG. 2. It is to be noted that FIGS. 2 and 3 are schematic sectional views, and that thicknesses of individual layers in the drawings are not in proportion to those of the corresponding layers in an actual device.

Referring to FIGS. 1 to 3, the VCSEL 1 includes a substrate 10, Distributed Bragg Reflector (DBR) layers 11 and 15, cladding layers 12 and 14, an active layer 13, and a current constriction layer 16 disposed within the DBR layer 15, an anode electrode layer 19, and a cathode electrode layer 20.

In this embodiment, a GaAs (gallium arsenic) semiconductor substrate exhibiting the conductivity type N is used as the substrate 10. The cathode electrode layer (rear surface electrode layer) 20 is formed on a rear surface of the substrate 10. Unlike the case illustrated in FIGS. 1 to 3, a non-doped GaAs substrate exhibiting a semi-insulating property may also be used as the substrate 10. In such a case, the cathode electrode layer 20 is formed on a surface of the DBR layer 11.

The Distributed Bragg Reflector (DBR) layer 11 constituted by a compound semiconductor exhibiting the conductivity type N is formed on the substrate 10. The DBR layer 11 includes a structure formed by alternately laminating, e.g., $Al_{0.15}Ga_{0.85}As$ and $Al_{0.9}Ga_{0.1}As$ in an optical film thickness of $\lambda/4$ ($\lambda$ denotes a wavelength) per layer. The DBR layer 11 is doped with Si (silicon) to exhibit the conductivity type N, and a concentration of the doped Si is, e.g., 2 to $3\times10^{18}$ $cm^{-3}$. Si tends to be coordinated at a Ga (Al) site and to become a donor.

$Al_xGa_{(1-x)}As$ (aluminum gallium arsenic) is a mixed crystal semiconductor of GaAs and AlAs, and it exhibits a wider energy gap and a lower refractive index as an Al composition (X) increases. Because the lattice constant hardly changes depending on the Al composition (X), an $Al_xGa_{(1-x)}As$ film having any Al composition (X) can be epitaxially grown on a GaAs substrate. In this Description, $Al_xGa_{(1-x)}As$ is simply expressed by AlGaAs in some cases when the Al composition (X) is not needed to be specified.

An active region generating a laser beam is formed on the DBR layer 11. The active region is constituted by the cladding layers 12 and 14, and the active layer 13 that is sandwiched between the cladding layers 12 and 14, and that provides an optical gain. A Multiple Quantum Well (MQW) is formed in the active layer 13 by multiply-laminating a quantum well layer and a barrier layer. The active layer 13 is a non-doped region where impurities are not doped.

The cladding layers 12 and 14 may be non-doped or partly doped depending on design of a device resistance value. In this embodiment, the cladding layers 12 and 14 contacting the N-type and P-type DBR layers 11 and 15 are partly doped with impurities having the same conductivity types as the DBR layers 11 and 15 adjacent thereto.

The DBR layer 15 being on the upper side and constituted by a compound semiconductor exhibiting the conductivity type P is formed on the active region. The DBR layer 15 on the upper side constitutes an optical resonator in cooperation with the DBR layer 11 on the lower side. The DBR layer 15 except for the current constriction layer 16 includes a structure formed by alternately laminating, e.g., $Al_{0.15}Ga_{0.85}As$ and $Al_{0.9}Ga_{0.1}As$ in an optical film thickness of λ/4 per layer, as in the DBR layer 11 on the lower side (substrate side). The DBR layer 15 is doped with C (carbon) to exhibit the conductivity type P, and a concentration of the doped C is, e.g., 2 to $3 \times 10^{18}$ cm$^{-3}$. C tends to be coordinated at an As site and to become an acceptor.

The conductivity types may be reversed to those described above such that the substrate 10 is constituted by a P-type semiconductor substrate, the conductivity type of the lower DBR layer 11 is set to the P-type, and the conductivity type of the upper DBR layer 15 is set to the N-type. It is to be noted that when expressions "first and second conductivity types" are used in this Description, one of the first and second conductivity types is the P-type and the other is the N-type.

The current constriction layer 16 is formed in a part of the upper DBR layer 15 for the purpose of efficiently injecting a current into the active region and developing a lens effect. As illustrated in FIG. 3, the current constriction layer 16 includes a non-oxidized portion 18 in a central portion, and an oxidized portion 17 that is present around the non-oxidized portion 18 and that is made of substantially an insulator. Such a structure is obtained by forming a to-be-oxidized layer, which becomes the current constriction layer 16, with $Al_xGa_{(1-x)}As$ on condition of $0.95 \leq X \leq 1$ (including the case of X=1, i.e., AlAs), processing a multilayer epitaxial film, which includes the to-be-oxidized layer, into a mesa post shape, and then selectively oxidizing the to-be-oxidized layer from the surroundings in an atmosphere of heated water vapor. Since only the non-oxidized portion 18 in the central portion serves as a current path, the current can be efficiently injected into the active region.

As illustrated in FIGS. 1 and 2, an insulating film 21 for moisture resistance (also called a moisture-resistant film) is formed on the multilayer epitaxial film having a mesa post structure. An opening is formed in the insulating film 21 positioned on the mesa post structure to make a surface of the DBR layer 15 exposed. An anode electrode layer 19 (ring electrode layer) is connected to the exposed surface of the DBR layer 15. A pad electrode 23 for bonding is connected to the anode electrode layer 19. A polyimide pattern 22 is disposed between the pad electrode 23 and the DBR layer 11 to reduce parasitic capacitance.

Distribution of Al Composition

Figure 4:
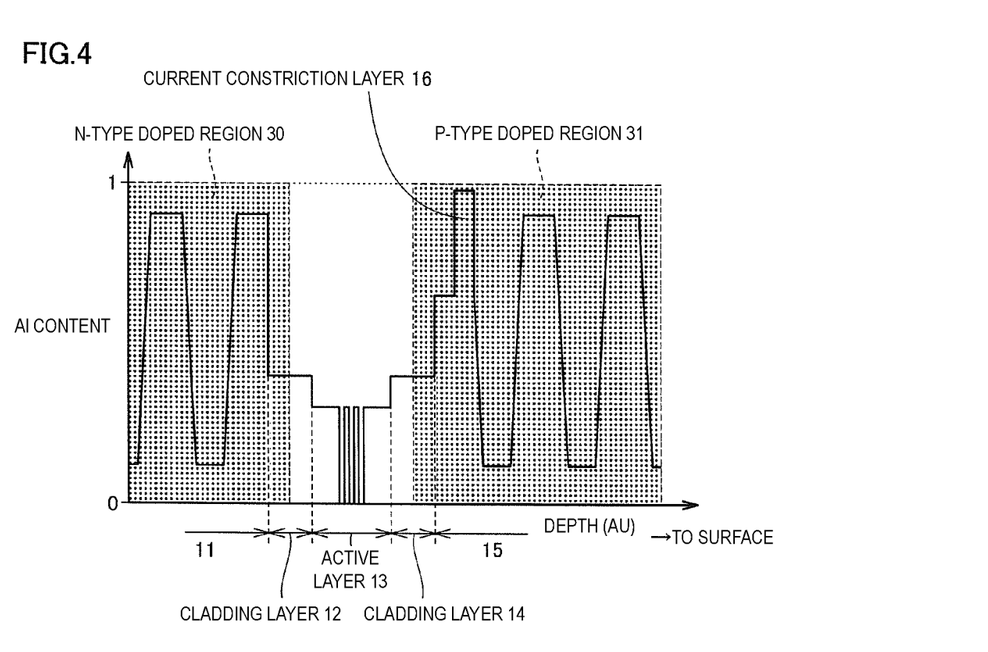
FIG. 4 is a graph depicting a distribution of Al compositions in individual layers of FIG. 3.

FIG. 4 is a graph depicting a distribution of Al compositions in individual layers of FIG. 3. A vertical axis of FIG. 4 represents an Al content (X) of $Al_xGa_{(1-x)}As$, and a horizontal axis represents a depth direction of the VCSEL in an arbitrary unit (AU). The case of X=0 implies GaAs, and the case of X=1 implies AlAs.

Referring to FIG. 4, in each of the DBR layers 11 and 15, a low refractive-index layer having a large Al content and a high refractive-index layer having a small Al content are alternately laminated. In the DBR layers 11 and 15, respective regions adjacent to the cladding layers 12 and 14 each correspond to the first low refractive-index layer. In the case of FIG. 4, the current constriction layer 16 is formed at a position within the first low refractive-index layer of the DBR layer 15, the position being most spaced from the active layer 13. The current constriction layer 16 may be arranged within the first low refractive-index layer at the lower side than the case of FIG. 4 (e.g., at a position adjacent to the cladding layer 14). A P-type doped region 31 extends over the DBR layer 15 and reaches the inside of the cladding layer 14 partly.

While, in FIG. 4, the current constriction layer 16 is formed within the first low refractive-index layer that constitutes the DBR layer 15, it may be arranged at a position closer to the active layer 13, e.g., at a position within the cladding layer 14. Stated in a more general way, the current constriction layer 16 is arranged within the DBR layer 15 or between the DBR layer 15 and the active layer 13. As an alternative, the current constriction layer 16 may be arranged at the side closer to the substrate 10 than the active layer 13. Thus, the current constriction layer 16 may be arranged within the DBR layer 11 or between the DBR layer 11 and the active layer 13.

Process of Fabricating VCSEL

Figure 10:
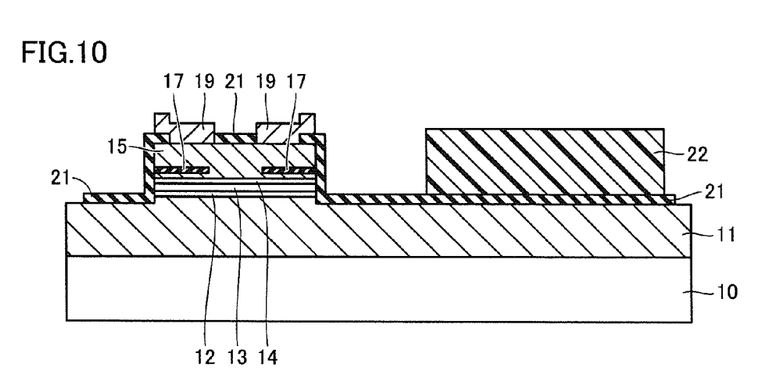
FIG. 10 is a sectional view schematically illustrating formation of a polyimide pattern in the process of fabricating the VCSEL.
Figure 11:
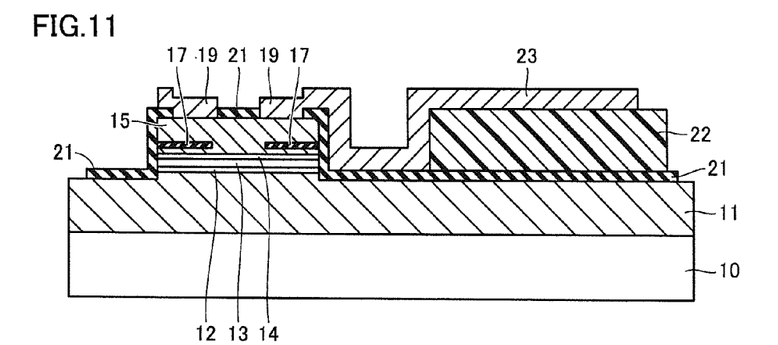
FIG. 11 is a sectional view schematically illustrating formation of a pad electrode in the process of fabricating the VCSEL.
Figure 12:
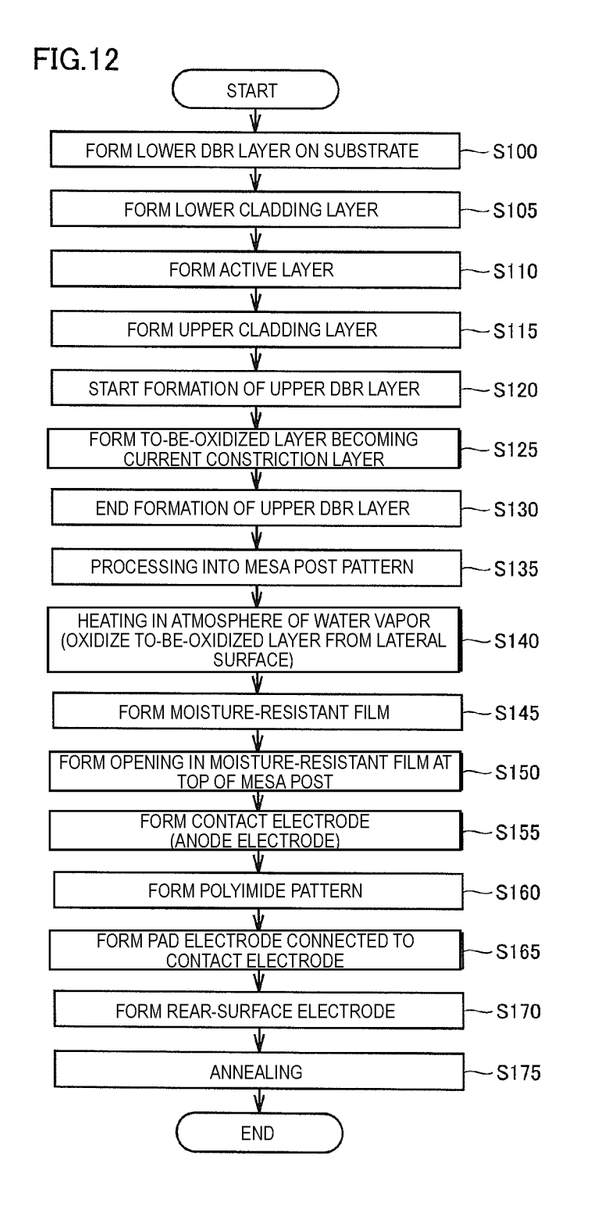
FIG. 12 is a flowchart representing the process of fabricating the VCSEL.

FIGS. 5 to 11 are sectional views schematically illustrating a process of fabricating the VCSEL. FIG. 12 is a flowchart representing the process of fabricating the VCSEL. A method of fabricating the VCSEL 1 illustrated in FIGS. 1 to 4 will be described below with reference to FIGS. 5 to 12.

Figure 5:
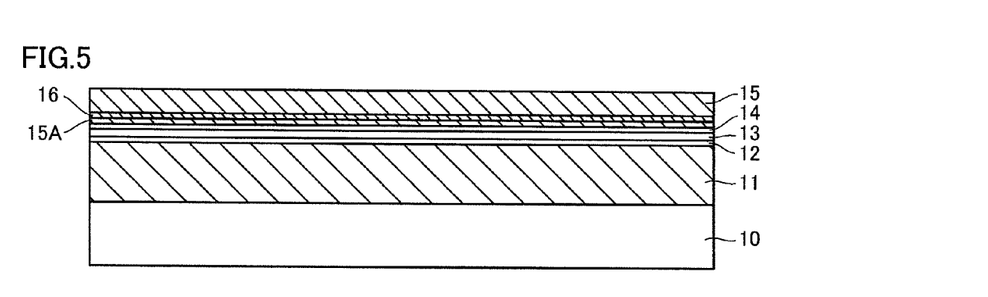
FIG. 5 is a sectional view schematically illustrating a multilayer epitaxial film in a process of fabricating the VCSEL.

Referring to FIG. 5, the epitaxial films 11 to 16 are formed in a multilayer form on the semiconductor substrate 10 (N-type GaAs substrate in this embodiment). MOCVD (Metal Organic Chemical Vapor Deposition) or MBE (Molecular Beam Epitaxy) is suitably used as a method to form the epitaxial films.

More specifically, the DBR layer 11 exhibiting the conductivity type N is first formed on the GaAs substrate 10 (step S100 in FIG. 12). The DBR layer 11 is formed in a structure of 30 to 40 paired layers, each pair including a high refractive-index region and a low refractive-index region in an optical film thickness of λ/4 per layer. $Al_xGa_{(1-x)}As$ with X=about 0.1 can be utilized as a high refractive-index material, and $Al_xGa_{(1-x)}As$ with X=about 0.9 can be utilized as a low refractive-index material. The DBR layer 11 is doped with Si as impurities at about $2 \times 10^{18}$ cm$^{-3}$ to exhibit the conductivity type N.

Next, the active layer 13 including a Quantum Well (QW) is formed on the N-type DBR layer 11 in a state sandwiched between the cladding layers 12 and 14 (steps S105 to S115 in FIG. 12). Respective film thicknesses and materials of the active layer 13 and the cladding layers 12 and 14 can be adjusted as appropriate depending on an oscillation wavelength. For example, the adjustment can be made to obtain the oscillation wavelength of 850 nm in the case of utilizing GaAs as the material of the active layer 13.

Next, the P-type DBR layers 15 and 15A are formed on the cladding layer 14 (i.e., steps S120 to S130 in FIG. 12). As in the N-type DBR layer 11, the P-type DBR layers 15 and 15A are each formed in a structure of about 20 paired layers, each pair including a high refractive-index region and a low refractive-index region in an optical film thickness of λ/4 per layer. $Al_xGa_{(1-x)}As$ with X=about 0.1 can be utilized as a high refractive-index material, and $Al_xGa_{(1-x)}As$ with X=about 0.9 can be utilized as a low refractive-index material. The DBR layer 15 and 15A are each doped with C as impurities at about $2 \times 10^{18}$ cm$^{-3}$ to exhibit the conductivity type P.

In the structure illustrated in FIGS. 1 to 4, the to-be-oxidized layer becoming the current constriction layer 16 is formed in the first low refractive-index layer contacting the cladding layer 14. More specifically, for example, the $Al_xGa_{(1-x)}As$ layer 15A (X=0.65) is formed on the cladding layer 14 while C (carbon) is doped at about 2 to $3 \times 10^{18}$ cm$^{-3}$ (steps S120 in FIG. 12). Then, the Al composition X is increased to 0.95 or more and the $Al_xGa_{(1-x)}As$ layer ($0.95 \leq X \leq 1$) is formed as the to-be-oxidized layer while C (carbon) is doped at about 2 to $3 \times 10^{18}$ cm$^{-3}$ (steps S125 in FIG. 12).

Because the to-be-oxidized layer becoming the current constriction layer 16 generates distortion due to volume shrinkage caused during an oxidation process, its thickness is desirably set to 40 nm or less to suppress the influence of the distortion. As described above in connection with FIG. 4, the to-be-oxidized layer may be formed within the first low refractive-index layer at a position closer to the overlying layer or underlying layer.

Figure 6:
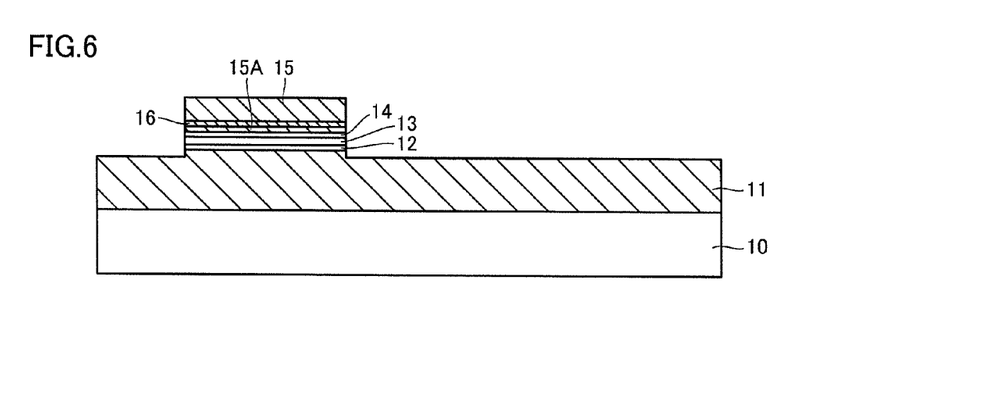
FIG. 6 is a sectional view schematically illustrating formation of a mesa post structure in the process of fabricating the VCSEL.

Referring to FIG. 6, a multilayer epitaxial film (multilayer body), which has been formed on the substrate 10 as described above, is processed into a mesa post pattern with a diameter ϕ of, e.g., 30 µm in order to form a current constriction structure (step S135 in FIG. 12). The mesa post pattern is formed by methods of photolithography and dry etching. The dry etching needs to be performed at least until a lateral surface of the to-be-oxidized layer becoming the current constriction layer 16 is exposed. In FIG. 6, the dry etching is performed until reaching a depth at which the surface of the lower DBR layer 11 is exposed.

Figure 7:
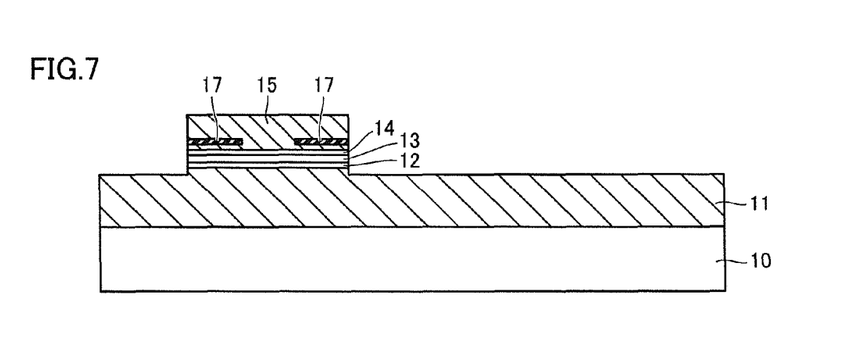
FIG. 7 is a sectional view schematically illustrating oxidation of an outer peripheral portion of a current constriction layer in the process of fabricating the VCSEL.

Referring to FIG. 7, the oxidized portion 17 is then formed by heating the substrate including the multilayer epitaxial film, which has been processed into the mesa post pattern, to 450° C. or higher in an atmosphere of water vapor, thus causing oxidation of the to-be-oxidized film becoming the current constriction layer 16 to progress selectively from an outer peripheral portion thereof (step S140 in FIG. 12). An oxidation time is adjusted such that the non-oxidized portion 18 in a central portion has a diameter ϕ of 10 µm.

Figure 8:
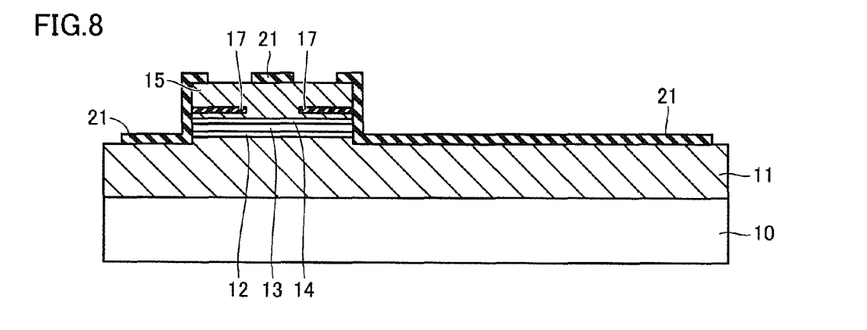
FIG. 8 is a sectional view schematically illustrating formation of a moisture resistant film in the process of fabricating the VCSEL.

Referring to FIG. 8, a silicon nitride film or a silicon oxide film is then formed as the moisture-resistant film 21 (step S145 in FIG. 12). For example, CVD or sputtering can be used as a method to form the moisture-resistant film 21. An opening adapted for a contact electrode layer is formed at a top of the mesa post is formed by methods of photolithography and dry etching (step S150 in FIG. 12).

Figure 9:
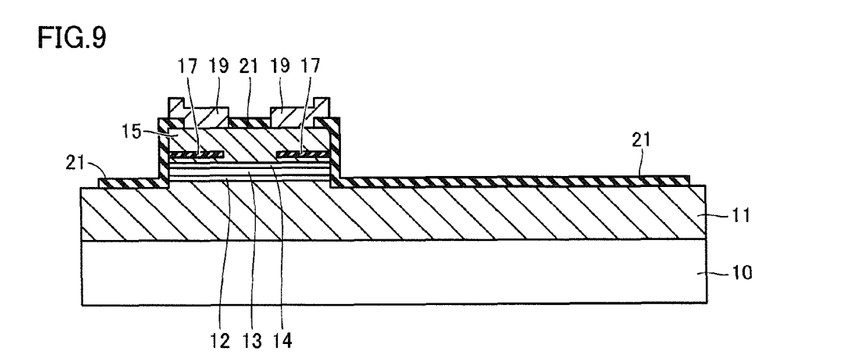
FIG. 9 is a sectional view schematically illustrating formation of a contact electrode in the process of fabricating the VCSEL.

Referring to FIG. 9, the P-type contact electrode layer (anode electrode layer) 19 is formed in the opening at the top of the mesa post by, e.g., photolithography and vapor deposition (steps S155 in FIG. 12). A multilayer film made of Ti (titanium), Pt (platinum), and Au (gold), for example, can be utilized as the P-type contact electrode layer 19.

Referring to FIG. 10, the polyimide pattern 22 is then formed for the purpose of reducing capacitance under the pad electrode 23 (step S160 in FIG. 12). Referring to FIG. 11, the pad electrode 23 connected to the P-type contact electrode layer is then formed by a film forming method including, e.g., photolithography and sputtering (steps S165 in FIG. 12).

Then, as illustrated in FIGS. 1 to 3, the rear-surface electrode layer 20 is formed after adjusting the thickness of the substrate 10 (step S170 in FIG. 12). A multilayer film made of Au, Ge and Ni, for example, can be used as the rear-surface electrode layer 20. An annealing process is further performed (step S175 in FIG. 12) to establish ohmic contact between each of the electrode layers 19 and 20 and the semiconductor layer. The VCSEL 1 is thus completed.

Details of Method of Forming Current Constriction Structure

A method of forming the current constriction layer with oxidation using heated water vapor (step S140 in FIG. 12), which is the feature of the present disclosure, will be described below.

Figure 13:
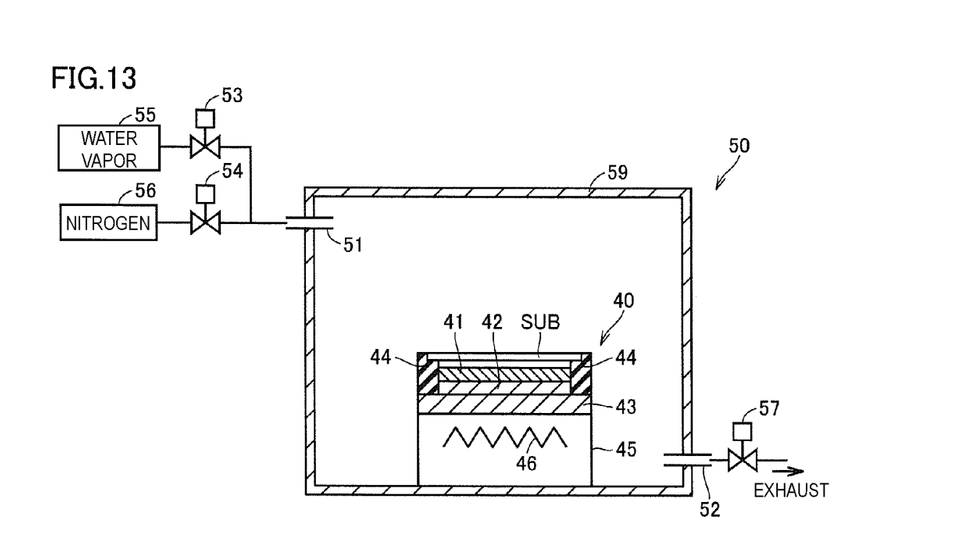
FIG. 13 is a sectional view schematically illustrating a configuration of an oxidation furnace.

FIG. 13 is a sectional view schematically illustrating a configuration of an oxidation furnace. Referring to FIG. 13, the oxidation furnace 50 includes a chamber 59, a substrate heating mechanism 40 disposed inside the chamber 59, and pipes 51 and 52 penetrating through a wall of the chamber 59.

The pipe 51 is connected to a water vapor supply source through a valve 53, and to a nitrogen supply source 56 through a valve 54. With such an arrangement, a gas mixture of water vapor and nitrogen can be supplied to the chamber 59.

The pipe 52 is used as an exhaust port, and gas within the chamber is exhausted through a valve 57. When pressure in the chamber 59 is to be reduced, the pipe 52 may be connected to an evacuation apparatus (e.g., a vacuum pump) through the valve 57.

Figure 14:
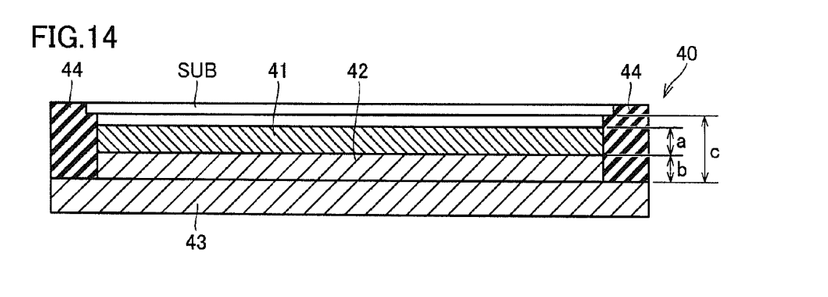
FIG. 14 is an enlarged sectional view schematically illustrating a principal part of a substrate heating mechanism 40 illustrated in FIG. 13.

FIG. 14 is an enlarged sectional view schematically illustrating a principal part of the substrate heating mechanism illustrated in FIG. 13. Referring to FIGS. 13 and 14, the substrate heating mechanism 40 includes heat conduction members 42 and 43, a uniformly-heated plate 41 placed on the heat conduction member 42, a spacer 44 attached to the conduction member 42, and a heater device 45 for heating the heat conduction member 43.

The heat conduction members 42 and 43 are each made of a material having an isotropic thermal conductivity, e.g., an isotropic carbon material. The thermal conductivity of the isotropic carbon material is, e.g., 110 W/(K·m). While FIG. 14 illustrates a structure in which the heat conduction members 42 and 43 in the form of two plates are laid one above the other, they may be formed as one structure.

A lower surface of the heat conduction member 43 (on the side oppositely away from a substrate SUB as a heating object) is heated by the heater device 45. The heater device 45 may be a hot plate including an electrically-heated wire 46 embedded therein, or a lamp heater.

The uniformly-heated plate 41 is placed on an upper flat surface of the heat conduction member 42. The uniformly-heated plate 41 is made of an anisotropic material having a larger thermal conductivity in a planar direction larger than in a vertical direction. For example, Pyrolytic Graphite (PG) can be used as the material of the uniformly-heated plate 41. The thermal conductivity of the PG is, e.g., 350 W/(K·m) in the planar direction, and 2 W/(K·m) in the vertical direction. In this case, a ratio of the thermal conductivity in the planar direction to the thermal conductivity in the vertical direction is 175:1. Furthermore, it is desirable that the thermal conductivity of the uniformly-heated plate 41 in the planar direction is larger than the thermal conductivity of the heat conduction member 42, and that the thermal conductivity of the uniformly-heated plate 41 in the vertical direction is fairly smaller than the thermal conductivity of the heat conduction member 42.

The spacer 44 is attached to the heat conduction member 42, and it supports a peripheral edge portion of the substrate SUB. In order to suppress heating of the substrate SUB through thermal conduction via the spacer 44, the thermal conductivity of the spacer 44 is desirably isotropic and is smaller than that of the uniformly-heated plate 41 in the vertical direction. For example, a ceramic material having the thermal conductivity of 1.6 W/(K·m) can be used as the spacer 44.

Thicknesses of individual components of the substrate heating mechanism 40 can be set, by way of example, such that a thickness b of the heat conduction member 42 is 2.7 mm, and a thickness a of the uniformly-heated plate 41 is 2 mm. In such a case, by setting a distance c from an upper surface of the heat conduction member 43 to a lower surface of the substrate SUB (i.e., a height of the spacer) to 5 mm, a space of 0.3 mm can be formed between the uniformly-heated plate 41 and the substrate SUB. Thus, the substrate SUB is heated by radiant heat from the uniformly-heated plate 41.

Figure 15:
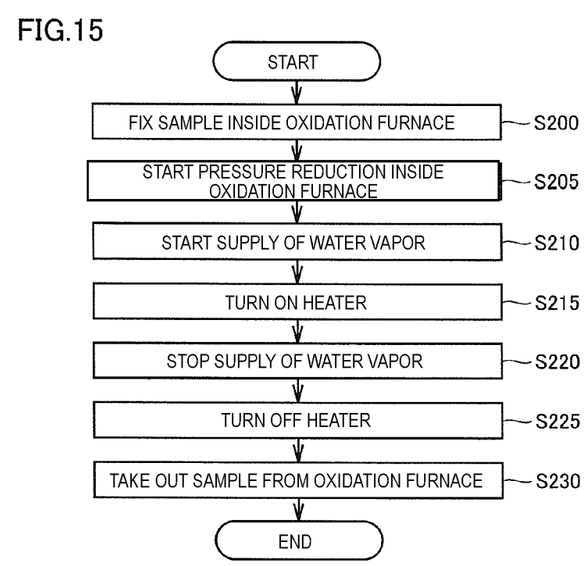
FIG. 15 is a flowchart representing procedures of a heated water-vapor oxidation step (step S140 in FIG. 12).

FIG. 15 is a flowchart representing procedures of a heated water-vapor oxidation step (step S140 in FIG. 12). Referring to FIGS. 13 and 15, a sample (i.e., a substrate including a multilayer body processed into a mesa post shape) is first fixed to a predetermined position of the substrate heating mechanism 40 inside the chamber 59 of the oxidation furnace (i.e., onto the spacer 44 in FIG. 14) (step S200).

Next, when the oxidation using heated water vapor is to be performed under reduced pressure, reduction of pressure within the chamber 59 of the oxidation furnace is started (step S205). Thereafter, supply of a gas mixture of water vapor and nitrogen to the chamber 59 is started (step S210). The pressure within the chamber 59 is determined depending on balance between a supply amount and an exhaust amount of the gas mixture of water vapor and nitrogen. By heating under the reduced pressure, the heating of the substrate through thermal conduction via gas is suppressed, and the substrate is mainly heated by heat radiation from the uniformly-heated plate 41. Accordingly, uniformity in the temperature of the substrate can be further increased.

On the other hand, when the oxidation using heated water vapor is to be performed under the atmospheric pressure, the step S205 is not executed. In such a case, the supply of the gas mixture of water vapor and nitrogen to the chamber 59 is started (step S210) in a state where the valve in the pipe 51 is opened.

When the atmosphere of water vapor is formed inside the chamber 59 and when the pressure in the chamber reaches a predetermined value in the case of the oxidation under the reduced pressure, heating of the heat conduction member 43 is started by the heater device 45. An amount of heat applied to the heat conduction member 43 from the heater device 45 (more specifically, an amount of current flowing through the electrically-heated wire 46) is feedback-controlled depending on a temperature value detected at a particular position of the substrate (sample). In practice, the temperature at the particular position (e.g., a central position) of the substrate is controlled to be held at a predetermined setting temperature between 450° C. and 500° C.

After a predetermined oxidation time has elapsed from heater-on, the supply of water vapor is stopped (step S220), and the heating by the heater device 45 is turned off (step S225). Thereafter, the sample is cooled down to near the room temperature and is then taken out from the chamber 59 of the oxidation furnace.

Result of Comparison Experiment

To confirm the effect of the uniformly-heated plate 41, an experiment for comparing in-plane distributions of the substrate temperature was conducted between the case where the uniformly-heated plate 41 was disposed in the substrate heating mechanism 40 constituted as illustrated in FIG. 14 (Condition 1) and the case where the uniformly-heated plate 41 was not so disposed (Condition 2). The substrate temperature was measured at plural positions within a diameter ϕ of 40 mm from the center of substrate. When an output of the heater device 45 was set such that an average value of the substrate temperature is equal under both the Condition 1 and Condition 2, a standard deviation σ in the case where the uniformly-heated plate 41 was disposed (Condition 1) was 1.2° C., whereas a standard deviation σ in the case where the uniformly-heated plate 41 was not so disposed (Condition 2) was 3.9° C. In other words, the standard deviation σ was reduced to about ⅓ as a result of disposing the uniformly-heated plate 41, and the effect of making the substrate temperature more uniform by the uniformly-heated plate 41 was confirmed.

Advantageous Effect

According to the embodiment described above, with the uniformly-heated plate 41 placed on the upper surface of the heat conduction member 42, heat conducted from the heater device 45 through thermal conduction via the heat conduction members 42 and 43 is uniformized within the uniformly-heated plate 41. Since the substrate SUS is then heated by radiant heat from the uniformly-heated plate 41, the substrate temperature in the planar direction can be made more uniform. As a result, the oxidation rate of the to-be-oxidized layer ($Al_xGa_{(1-x)}As$ layer where $0.95 \leq X \leq 1$) becoming the current constriction layer 16 can be held constant in a plane, and in-plane variations in respective sizes of the non-oxidized portion 18 and the oxidized portion 17 illustrated in FIG. 3 can be suppressed.

Modification

In the embodiment described above, the multilayer body including the DBR layers 11 and 15, the cladding layers 12 and 14, the active layer 13, and the to-be-oxidized layer becoming the current constriction layer 16 is processed into the mesa post shape. However, the multilayer body may be processed into a recessed structure instead of the mesa post shape. Also in the recessed structure, oxidation is progressed from the lateral surface of the to-be-oxidized layer becoming the current constriction layer 16, whereby the oxidized portion is formed in a state surrounding the non-oxidized portion.

The embodiment disclosed here should be construed to be not restrictive, but illustrative in all respects. The scope of the present disclosure is defined in not the foregoing description, but in Claims, and is intended to involve all modifications that are equivalent to Claims in terms of meaning and scope.

The invention claimed is:

1. A manufacturing method for a vertical cavity surface emitting laser, the method comprising steps of:
    forming, on a substrate, a multilayer body including first and second Distributed Bragg Reflector layers, an active layer, and a to-be-oxidized layer becoming a current constriction structure;
    processing the multilayer body such that a lateral surface of at least the to-be-oxidized layer is exposed; and
    forming the current constriction structure by oxidizing the to-be-oxidized layer from the lateral surface thereof after the multilayer body has been processed,
    wherein the step of forming the current constriction structure includes steps of:
    placing a uniformly-heated plate on a heat conduction member, the uniformly-heated plate having a planar upper surface;
    positioning the substrate along the uniformly-heated plate so that the entire substrate is spaced from the planar upper surface of the uniformly-heated plate thereby forming a gap between the planar upper surface of the uniformly-heated plate and the substrate; and
    heating the substrate by radiant heat from the uniformly-heated plate by heating the heat conduction member,
    wherein the uniformly-heated plate is made of an anisotropic material having a larger thermal conductivity in a planar direction than in a vertical direction, and wherein the step of positioning the substrate includes a step of supporting a peripheral edge portion of the substrate by a spacer that is attached to the heat conduction member, and a thermal conductivity of the spacer is smaller than the thermal conductivity of the uniformly-heated plate in the vertical direction.

2. The manufacturing method for the vertical cavity surface emitting laser according to claim 1, wherein a material of the uniformly-heated plate is Pyrolytic Graphite.

3. The manufacturing method for the vertical cavity surface emitting laser according to claim 1, wherein the heat conduction member and the uniformly-heated plate are disposed within an oxidation furnace, and
the step of heating the substrate is executed in a state that pressure in the oxidation furnace is reduced.

4. The manufacturing method for the vertical cavity surface emitting laser according to claim 1, wherein the step of heating the substrate is implemented after the step of positioning the substrate.

\* \* \* \* \*